(12) United States Patent
Haba

(10) Patent No.: US 6,674,161 B1
(45) Date of Patent: Jan. 6, 2004

(54) SEMICONDUCTOR STACKED DIE DEVICES

(75) Inventor: Belgacem Haba, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 25 days.

(21) Appl. No.: 09/679,143

(22) Filed: Oct. 3, 2000

(51) Int. Cl.[7] .......................... H01L 23/04; H01L 23/48; H01L 23/52; H01L 29/40

(52) U.S. Cl. ........................ 257/686; 257/777; 257/723; 257/685; 257/698; 257/696; 257/735; 257/734; 257/966; 257/296; 257/303; 257/67; 257/68

(58) Field of Search ........................ 257/686, 685, 257/723, 696, 693, 698, 68, 67, 296, 303, 906, 777, 734, 735

(56) References Cited

U.S. PATENT DOCUMENTS

| | | | | |
|---|---|---|---|---|
| 4,394,712 A | * | 7/1983 | Anthony | 361/411 |
| 5,229,647 A | * | 7/1993 | Gnadinger | 257/686 |
| 5,291,061 A | | 3/1994 | Ball | 257/686 |
| 5,397,916 A | | 3/1995 | Normington | 257/686 |
| 5,424,920 A | * | 6/1995 | Miyake | 257/777 |
| 5,434,745 A | | 7/1995 | Shokrgozar et al. | 361/735 |
| 5,682,062 A | * | 10/1997 | Gaul | 257/686 |
| 5,864,177 A | | 1/1999 | Sundstrom | 257/723 |
| 5,973,396 A | * | 10/1999 | Farnworth | 257/698 |
| 6,051,886 A | | 4/2000 | Fogal et al. | 257/777 |
| 6,093,938 A | | 7/2000 | Minemier et al. | 257/80 |
| 6,104,082 A | * | 8/2000 | Berlin et al. | 257/665 |
| 6,109,929 A | * | 8/2000 | Jasper | 361/790 |
| 6,160,312 A | * | 12/2000 | Raad | 257/723 |
| 6,239,495 B1 | * | 5/2001 | Sakui et al. | 257/777 |
| 6,271,587 B1 | * | 8/2001 | Patti | 257/686 |
| 6,350,633 B1 | * | 2/2002 | Lin | 438/113 |
| 6,355,501 B1 | * | 3/2002 | Fung et al. | 438/107 |
| 6,380,615 B1 | * | 4/2002 | Park et al. | 257/686 |
| 6,381,141 B2 | * | 4/2002 | Corisis et al. | 257/686 |

FOREIGN PATENT DOCUMENTS

EP          0314437 A1 *  5/1989 .................. 257/686

* cited by examiner

Primary Examiner—Alexander O. Williams
(74) Attorney, Agent, or Firm—Lee & Hayes, PLLC

(57) ABSTRACT

Semiconductor devices and methods of forming semiconductor devices are described. In one embodiment, at least one conductive structure is formed within a plurality of semiconductor substrates. At least portions of one of the conductive structures have oppositely facing, exposed outer surfaces. Individual substrates are stacked together in a die stack such that individual conductive structures on each substrate are in electrical contact with the conductive structures on a next adjacent substrate. In a preferred embodiment, the conductive structures comprise multi-layered, conductive pad structures.

40 Claims, 3 Drawing Sheets

SEMICONDUCTOR STACKED DIE DEVICES

TECHNICAL FIELD

This invention relates to generally to semiconductor devices and, more particularly to semiconductor stacked die constructions and methods of forming the same.

BACKGROUND

Semiconductor devices are typically constructed from a silicon or gallium arsenide wafer through a process involving a number of deposition, masking, diffusion, etching, and implanting steps. Usually, many individual devices are constructed on the same wafer. After fabrication, the wafer is typically sawed or otherwise singulated into individual units, where each unit takes the form of an integrated circuit (IC) die.

It has become a practice in the industry to provided integrated circuit devices in the form of so-called "stacked die" arrangements. Stacked die arrangements typically involve two or more IC die that are fixed upon one another, typically through some type of adhesive arrangement. Interconnections can then be made between the individual die to provide an overall device with a desirable density and enhanced functionality.

Examples of stacked die arrangements are described in detail in the following U.S. Patents, to which the reader is referred for additional detail: U.S. Pat. Nos. 5,291,061; 6,051,886; 5,397,916; 5,434,745; 6,093,939; and 5,864,177.

To date, interconnections between the individual die of stacked die arrangements have been made at or near the periphery of each die. U.S. Pat. Nos. 5,291,061, and 5,397,916 provide very good examples of this type of interconnection. As device processing speeds continue to increase, those involved in the design of semiconductor devices are necessarily forced to consider and reconsider traditionally accepted notions of circuit design. One particular area of interest in the industry concerns the design and fabrication of memory devices, and particularly those memory devices that employ stacked die arrangements.

Accordingly, this invention arose out of concerns associated with providing improved systems that employ stacked die arrangements, and methods of forming the same.

SUMMARY

Semiconductor devices and methods of forming semiconductor devices are described. In one embodiment, at least one conductive structure is formed within a plurality of semiconductor substrates. At least portions of one of the conductive structures has oppositely facing, exposed outer surfaces. Individual substrates are stacked together such that individual conductive structures on each substrate are in electrical contact with the conductive structure on a next adjacent substrate.

In another embodiment, at least one conductive structure is formed within each of a plurality of semiconductor substrates. The conductive structures have oppositely-facing surfaces. Portions of each oppositely-facing surface are exposed on at least one of the substrates. The substrates are processed sufficient to form electrical connections between the substrates by stacking the substrates on one another so that the conductive structures on adjacent substrates are electrically connected.

In yet another embodiment, at least one multi-layered, conductive pad structure is formed within each of a plurality of semiconductor substrates. Each conductive pad structure has oppositely-facing surfaces. Portions of each oppositely-facing surface are exposed on at least one of the substrates. At least one such surface is exposed by etching portions of the substrate. After the oppositely-facing surface portions are exposed, additional conductive material is formed over and in electrical contact with the exposed surface portions by plating at least one additional conductive material over the exposed portions.

In still a further embodiment, a semiconductor device comprises a first semiconductor die comprising IC devices. At least one conductive structure is disposed within and through the first die and in operative contact with the IC devices. A second semiconductor die comprises IC devices, and is mounted together with the first die in a stacked arrangement. The second semiconductor die has at least one conductive structure disposed therewithin and in electrical contact with both the IC devices of the second semiconductor die and the conductive structure of the first semiconductor die.

In yet another embodiment, a semiconductor device comprises multiple semiconductor die, each of which comprising IC devices. At least one conductive structure is disposed generally in the center of each die. The multiple die are joined together in a die stack such that electrical contact between adjacent die is made through the conductive structures associated with each of the die.

DETAILED DESCRIPTION

Exemplary Embodiment

Figure 1:
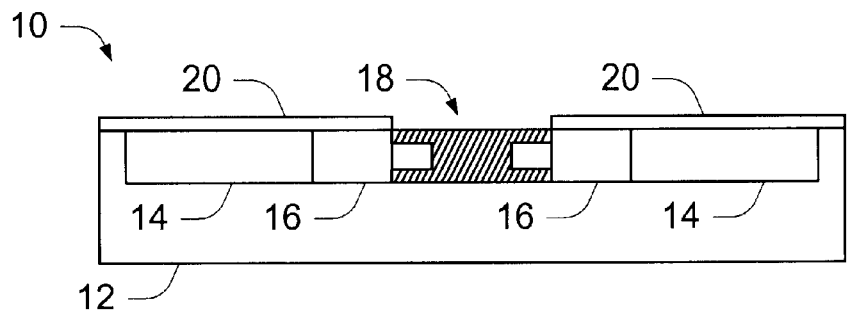
FIG. 1 is a diagrammatic side sectional view of a semiconductor wafer fragment, in process, in accordance with the described embodiment.

FIG. 1 shows a semiconductor wafer, in process, generally at 10 and includes a semiconductor substrate 12. In the context of this document, the term "semiconductor substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure including, but not limited, to the semiconductive substrates described above.

Substrate 12 includes regions 14 that are fabricated to contain or comprise integrated circuit (IC) devices. In a preferred implementation, the integrated circuit devices comprise memory devices. One type of exemplary memory device is a dynamic random access memory (DRAM) device, such as DRAM devices designed by the assignee of this document. It is to be understood, however, that this constitutes but one exemplary type of integrated circuit device that can be provided. Other types of integrated circuit devices (and not necessarily memory devices) can be provided without departing from the spirit and scope of the claimed subject matter.

A pair of regions 16 are shown and comprise interface regions that are designed to provide an interface between the integrated circuit devices within regions 14 and other circuitry that is external of the substrate 12.

A conductive structure 18 is formed within and supported by substrate 12. The exemplary structure 18 can comprise any suitable type of conductive structure and is positioned to make electrical contact with regions 16, and other conductive structures that will ultimately electrically connect the integrated circuit devices to the outside world, as will become apparent below. In a preferred implementation, conductive structure 18 comprises a multi-layered pad structure that is fabricated during processing of the devices in regions 14. The pad structure preferably comprises aluminum and can be formed through successive deposition/etching (or removal) steps.

The conductive structure can be formed at any suitable location within the substrate. It is desirable, however, to have the conductive structure formed at a substrate location that is not at the periphery of the substrate. This is because the conductive structure is going to be used to form electrical connections with other similar conductive structures on other substrates. These substrates will be mounted together in a stacked arrangement so that adjacent substrates are electrically connected through the conductive structures. The manner in which these electrical connections is to be made desirably eliminates the need to make such electrical connections between the substrates at the periphery of, and external to the substrates, as will become apparent below. In the illustrated example, the conductive structure is disposed within the center of the substrate.

An insulative layer 20 is formed over substrate 12 and patterned to expose a front side 18a of conductive structure 18 as shown.

Figure 2:
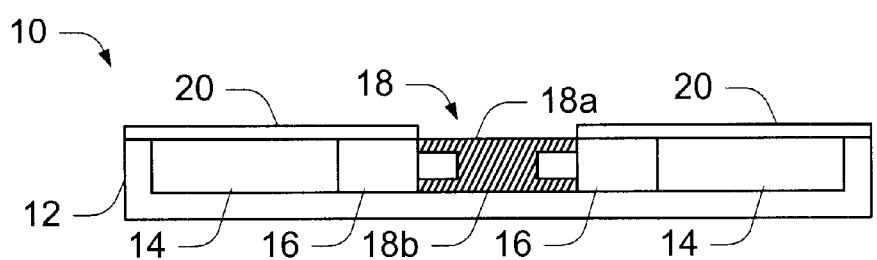
FIG. 2 is diagrammatic side sectional view of the FIG. 1 wafer fragment, in process, in accordance with the described embodiment.

Referring to FIG. 2, wafer 10 is processed to remove a portion of the back side of the wafer, thus thinning the wafer. The wafer can be thinned through the use of any suitable techniques. For example, the wafer can be mechanically (or chemically-mechanical) abraded or polished to achieve the desired thinned wafer.

Figure 3:
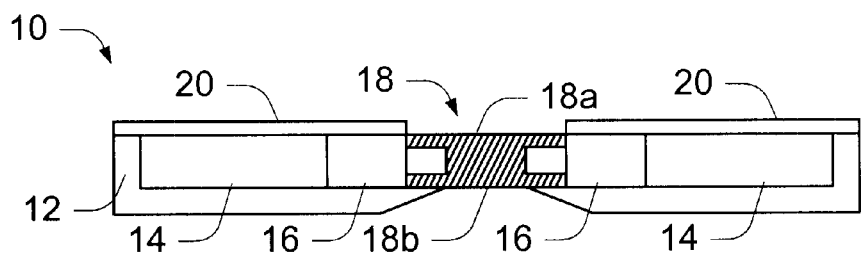
FIG. 3 is a diagrammatic side sectional view of the FIG. 2 wafer fragment, in process, in accordance with the described embodiment.

Referring to FIG. 3, portions of the wafer are removed, as by any suitable processing technique, sufficient to expose at least a portion of backside 18b of conductive structure 18. In the illustrated example, material of the wafer can be selectively etched, relative to the material from which the conductive structure 18 is formed, so that the back side 18b of the conductive structure is exposed. Thus, at this point in the processing of wafer 12, conductive structure 18 has portions of both of its oppositely-facing surfaces exposed.

Figure 4:
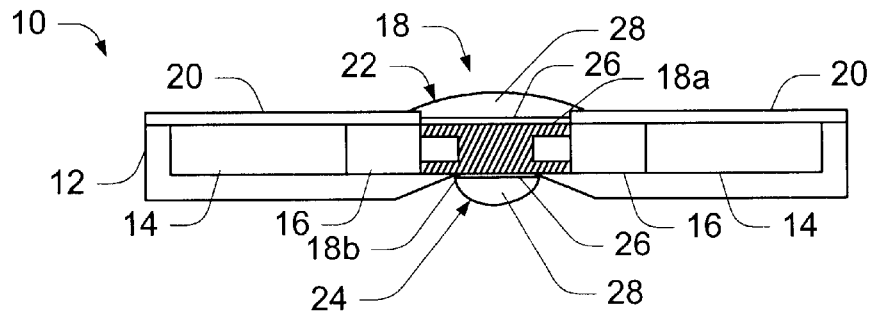
FIG. 4 is a diagrammatic side sectional view of the FIG. 3 wafer fragment, in process, in accordance with the described embodiment.

Referring to FIG. 4, additional conductive material 22, 24 is formed respectively, over and in electrical contact with the oppositely-facing surfaces (i.e. front side 18a and back side 18b) of conductive structure 18. In the illustrated and described embodiment, the conductive material is formed through known plating techniques. In this specific example, more than one conductive material is plated over the conductive structure 18. Specifically, a first conductive material 26, such as nickel, is first formed over the exposed surfaces of the conductive structure 18. Any suitable plating technique, e.g. electroless plating, can be used. After the first conductive material 26 is plated over the exposed surfaces of the conductive structure 18, a second conductive material 28 is formed over and in electrical contact with first conductive material 26. Any suitable techniques can be used such as sputtering, evaporating, or plating to name a few. In the illustrated and described embodiment, second conductive material 28 comprises gold. The second conductive material can, however, comprise any suitable conductive material. For example, an alloy of tin and gold can be used. For purposes of further discussion, conductive material 22 will be referred to as the "top most" conductive material, and conductive material 24 will be referred to as the bottommost" conductive material.

Notice that bottommost conductive material 24 is received entirely within an opening that is defined by a via that exposes the surface of the backside 18b of conductive structure 18. The reason for this will become apparent below.

It should be understood that while only one exemplary substrate is shown as being processed as described, in the preferred embodiment, multiple substrates are typically processed at one time so that they can be eventually joined or bonded together in a die stack.

Figure 5:
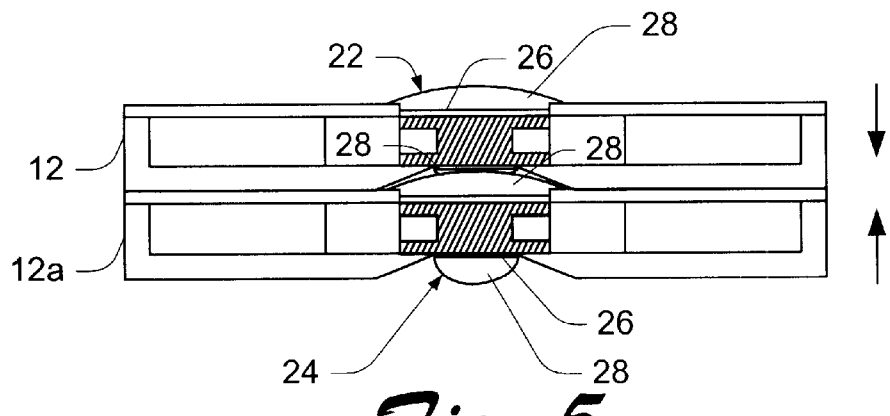
FIG. 5 is a diagrammatic side sectional view of two exemplary substrates mounted in a stacked die arrangement in accordance with the described embodiment.

Referring to FIG. 5, two exemplary substrates 12, 12a are shown. It will be appreciated that substrate 12a can be identical to or different from substrate 12. Substrates 12 and 12a are first moved into engagement with one another and then processed sufficiently such that a conductive bond forms between the bottommost conductive material of substrate 12 and the top most conductive material of substrate 12a. In one exemplary implementation, the conductive bond can be formed by stacking the substrates, either in wafer form or singulated die form, and then joining the conductive material on each of the substrates through ultrasonic thermal compression. This is a good technique to use when the top- and bottommost conductive materials comprise gold. Other techniques can, of course, be used, e.g. thermal compression.

The FIG. 5 construction can thus comprise a first die 12 having IC devices thereon and a second die 12a also having IC devices thereon. Die 12, 12a are mounted together in a stacked arrangement such that the conductive structures of each die are in electrical contact with one another. Thus, the necessity for any such electrical contact to be made external of the substrates or die can be eliminated.

Figure 6:
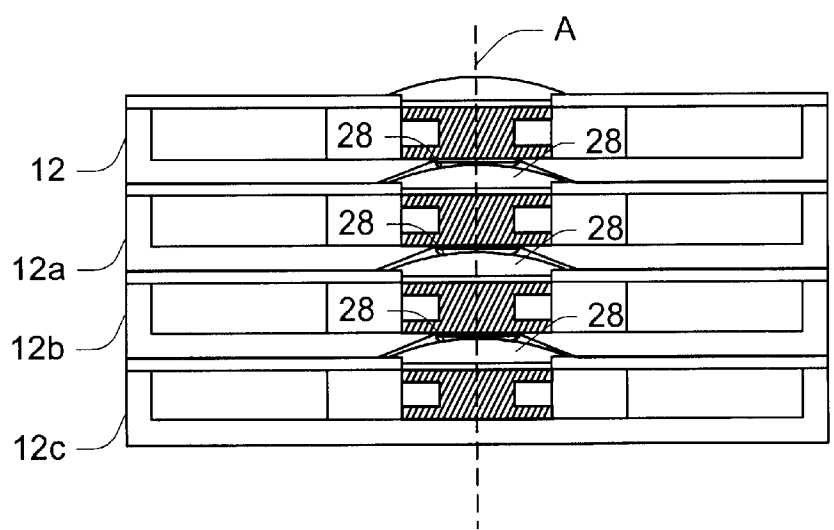
FIG. 6 is a diagrammatic side sectional view of four exemplary substrates mounted in a stacked die arrangement in accordance with the described embodiment.

The above technique can be used to form any suitable number of individual dies into a stacked die arrangement. For example, FIG. 6 shows an arrangement of multiple stacked die that consists of four separate substrates (12–12c) that are joined together as described above. Notice that substrate 12c does not have both faces of its conductive structure 18 exposed.

Hence, the inventive techniques described above enable multiple substrates or die to be formed into a stacked arrangement, with operative electrical connections between the die being made by virtue of conductive structures that are disposed entirely within internal regions of the die. In one preferred embodiment, the conductive structures are formed so that they are generally disposed in the center of each die. It is to be appreciated, however, that the conductive structures can be formed at any suitable location on or within the individual die. In the illustrated and described embodiment, the collection of conductive structures for each die are disposed along a common line A.

Figure 7:
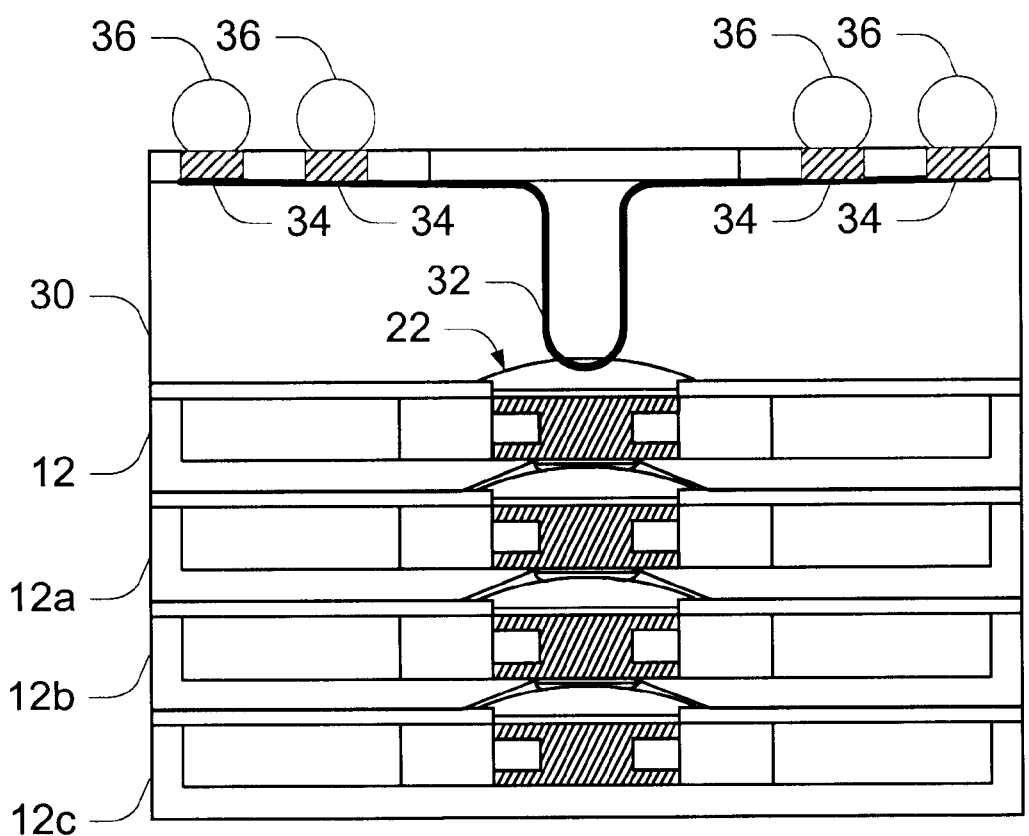
FIG. 7 is a diagrammatic side sectional view of the FIG. 6 wafer fragment, in process, in accordance with the described embodiment.

Once the die have been formed into a stacked arrangement as described above, they can further processed into individual packages. For example, FIG. 7 shows the FIG. 6 die stack where an insulative layer 30 has been formed over the die stack. A conductive line 32 is provided and makes contact with conductive material 22 of the uppermost die 12. Multiple conductive pads 34 are provided over layer 30, with exemplary solder balls 36 being received over each of the pads 34. Processing the die stack can now continue using conventional techniques to form an IC package, as will be appreciated and understood by those of skill in the art.

The various stacked die arrangements that can be formed through the inventive techniques described above are advantageous in that the connective distances as between the individual die can be drastically reduced over other constructions where connections are typically made at the periphery of the die. This is particularly advantageous in the field of memory devices, e.g. SDRAMs and the like, where, for performance purposes, it is highly desirable to reduce stub lengths to the shortest possible distances. In addition, the inventive techniques can enable increased package capacity while providing constructions that more easily dissipate heat. These constructions can more easily dissipate heat because the conductive material joining the individual die can act as a funneling mechanism for heat. Additionally, other material layers, e.g. non-conductive joining material can be formed on the die surfaces to provide not only mechanical support, but further assist in heat dissipation. In addition, the constructions that are provided by the inventive techniques can reduce the number of I/O connections per die. Other advantages will be apparent to those of skill in the art.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A semiconductor device comprising:
   a first singulated semiconductor die comprising IC devices, and having at least one conductive structure disposed within and through the die and in operative contact with the IC devices, the one conductive structure having a front side and a back side, the first singulated semiconductor die comprising a thinned semiconductor wafer portion;
   a via disposed in the semiconductor wafer portion and defining an opening, the via being joined with at least a portion of the back side of the one conductive structure, said thinned semiconductor wafer portion defining a generally planar surface that joins with said opening and is generally planar outside of an area occupied by said via;
   a second singulated semiconductor die comprising IC devices, and mounted together with the first die in a stacked arrangement, the second semiconductor die having at least one conductive structure disposed therewithin and in electrical contact with both the IC devices of the second semiconductor die and the conductive structure of the first semiconductor die, said electrical contact being established by conductive material that is received within said via.

2. The semiconductor device of claim 1, wherein at least one of the conductive structures comprises aluminum.

3. The semiconductor device of claim 1, wherein the conductive structures comprise aluminum.

4. The semiconductor device of claim 1, wherein at least one of the conductive structures comprises a multi-layered pad structure.

5. The semiconductor device of claim 1, wherein both of the conductive structures comprise a multi-layered pad structure.

6. The semiconductor device of claim 1, wherein at least one of the conductive structures comprises a multi-layered aluminum pad structure.

7. The semiconductor device of claim 1, wherein the first and second die support memory devices.

8. The semiconductor device of claim 1, wherein the first and second die support DRAM devices.

9. A semiconductor device comprising:
   multiple singulated semiconductor die each of which comprising IC devices and one or more interface region joined with the IC devices, individual semiconductor die comprising thinned semiconductor wafer portions;
   at least one conductive structure disposed generally in the center of each die and joining with an associated one or more interface region, said at least one conductive structure being disposed laterally adjacent said associated one or more interface region;
   at least one via disposed in at least one of the semiconductor wafer portions of at least one of the die, said one via joining with at least a portion of an associated conductive structure;
   the multiple die being joined together in a die stack such that electrical contact between adjacent die is made through the conductive structures associated with each of the die, said electrical contact being established, at least in part, by conductive material received within said one via.

10. The semiconductor device of claim 9, wherein said at least one conductive structure comprises aluminum.

11. The semiconductor device of claim 9, wherein said at least one conductive structure comprises a multi-layered pad structure.

12. The semiconductor device of claim 9, wherein said at least one conductive structure comprises a multi-layered aluminum pad structure.

13. The semiconductor device of claim 9, wherein said at least one conductive structure comprises a multi-layered pad structure having conductive material plated thereon.

14. The semiconductor divices of claim 9, wherein each of the multiple die support memory devices.

15. The semiconductor device of claim 9, wherein each of the multiple die support DRAM devices.

16. A semiconductor device comprising:
   a first singulated semiconductor die comprising IC devices, and having at least one conductive structure disposed within and rough the die and in operative contact with the IC devices, the conductive structure comprising a multi-layered pad structure, the one conductive structure having a front side and a back side, the first singulated semiconductor die comprising a thinned semiconductor wafer portion;
   a via disposed in the semiconductor wafer portion and defining an opening, said via being joined with at least a portion of the back side of the one conductive structure;

a second singulated semiconductor die comprising IC devices, and mounted together with the first die in a stacked arrangement, the second semiconductor die having at least one conductive structure disposed therewithin and comprising a multi-layered pad structure;

first conductive material plated over portions of each conductive structure;

second conductive material formed over the first conductive material of each structure and bonded together to form an electrical connection between the first and second semiconductor die;

at least some of the conductive material being received within said via.

17. The semiconductor device of claim 16, wherein the first conductive material comprises nickel.

18. The semiconductor device of claim 16, wherein the second conductive material comprises gold.

19. The semiconductor device of claim 16, wherein:

the first conductive material comprises nickel; and the second conductive material comprises gold.

20. The semiconductor device of claim 16, wherein at least one of the conductive structures comprises aluminum.

21. The semiconductor device of claim 16, wherein the conductive structures comprise aluminum.

22. The semiconductor device of claim 16, wherein the conductive structures are disposed generally in the centers of each die.

23. A semiconductor device comprising:

a first singulated semiconductor die comprising IC devices, and having at least one conductive structure disposed within and through the die and in operative contact with the IC devices, the one conductive structure having a front side and a back side, the first singulated semiconductor die comprising a semiconductor wafer portion;

a via disposed in the semiconductor wafer portion and which does not extend entirely through the wafer portion, the via defining an opening that tapers toward and joins with at least a portion of the back side of the one conductive structure; and a second singulated semiconductor die comprising IC devices, and mounted together with the first die in a stacked arrangement, the second semiconductor die having at least one conductive structure disposed therewithin and in electrical contact with both the IC devices of the second semiconductor die and the conductive structure of the first semiconductor die, said electrical contact being established by conductive material received within said via.

24. The semiconductor device of claim 23, wherein at least one of the conductive structures comprises aluminum.

25. The semiconductor device of claim 23, wherein the conductive structures comprise aluminum.

26. The semiconductor device of claim 23, wherein at least one of the conductive structures comprises a multi-layered pad structure.

27. The semiconductor device of claim 23, wherein both of the conductive structures comprise a multi-layered pad structure.

28. The semiconductor device of claim 23, wherein at least one of the conductive structures comprises a multi-layered aluminum pad structure.

29. The semiconductor device of claim 23, wherein the first and second die support memory devices.

30. The semiconductor device of claim 23, wherein the first and second die support DRAM devices.

31. A semiconductor device comprising:

a first singulated semiconductor die comprising IC devices, and having at least one conductive structure disposed within and through the die and in operative contact with the IC devices, the one conductive structure having a front side and a back side, the first singulated semiconductor die comprising a semiconductor wafer portion;

a first opening in the wafer portion adjacent and exposing the front side of the one conductive structure, the first opening having a width;

a second opening in the wafer portion adjacent and exposing the back side of the one conductive structure, the second opening having a width that is less than the width of the first opening;

a second singulated semiconductor die comprising IC devices, and mounted together with the first die in a stacked arrangement, the second semiconductor die having at least one conductive structure disposed therewithin and in electrical contact with both the IC devices of the second semiconductor die and the conductive structure of the first semiconductor die, said electrical contact being established by conductive material that is received over one of the front side and back side of the conductive structure of the first semiconductor die.

32. The semiconductor device of claim 31, wherein the second opening defines a portion of a via that tapers outwardly away from the first singulated semiconductor die.

33. The semiconductor device of claim 31, wherein the second opening defines a portion of a via that tapers outwardly away from the first singulated semiconductor die to define a width that is spaced from the conductive structure of the fist singulated semiconductor die and which is greater than the width of the first opening.

34. The semiconductor device of claim 31, wherein at least one of the conductive structures comprises aluminum.

35. The semiconductor device of claim 31, wherein the conductive structures comprise aluminum.

36. The semiconductor device of claim 31, wherein at least one of the conductive structures comprises a multi-layered pad structure.

37. The semiconductor device of claim 31, wherein both of the conductive structures comprise a multi-layered pad structure.

38. The semiconductor device of claim 31, wherein at least one of the conductive structures comprises a multi-layered aluminum pad structure.

39. The semiconductor device of claim 31, wherein the first and second die support memory devices.

40. The semiconductor device of claim 31, wherein the first and second die support DRAM devices.

* * * * *

UNITED STATES PATENT AND TRADEMARK OFFICE
CERTIFICATE OF CORRECTION

PATENT NO. : 6,674,161 B1
DATED : January 6, 2004
INVENTOR(S) : Haba

It is certified that error appears in the above-identified patent and that said Letters Patent is hereby corrected as shown below:

Column 6,
Line 51, replace "divices" with -- devices --.

Column 8,
Line 41, replace "fist" with -- first --.

Signed and Sealed this

Fifteenth Day of June, 2004

JON W. DUDAS
*Acting Director of the United States Patent and Trademark Office*